(12) United States Patent
Tsai et al.

(10) Patent No.: US 6,429,115 B1
(45) Date of Patent: Aug. 6, 2002

(54) METHOD OF MANUFACTURING MULTILEVEL INTERCONNECTS INCLUDING PERFORMING A SURFACE TREATMENT TO FORM A HYDROPHILIC SURFACE LAYER

(75) Inventors: Cheng-Yuan Tsai, Yunlin Hsien; Chin-Hsiang Lin, Nantou Hsien; Ming-Sheng Yang, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/801,330

(22) Filed: Mar. 7, 2001

(30) Foreign Application Priority Data

Feb. 27, 2001 (TW) ........................................ 90104468 A

(51) Int. Cl.[7] .......................................... H01L 21/4763
(52) U.S. Cl. ..................... 438/622; 438/644; 438/654; 438/687; 438/628
(58) Field of Search ................................ 438/628, 634, 438/644, 654, 677, 687, 902, 760, 761, 780, 781, 931, 622

(56) References Cited

U.S. PATENT DOCUMENTS 6,303,192 B1 * 10/2001 Annapragada et al. ...... 427/103
6,348,407 B1 * 2/2002 Gupta et al. ................ 438/622
2002/0016085 A1 * 2/2002 Huang et al. ............... 438/798

* cited by examiner

*Primary Examiner*—Matthew Smith
*Assistant Examiner*—Craig P Lytle
(74) *Attorney, Agent, or Firm*—J. C. Patents

(57) ABSTRACT

A method of manufacturing multilevel interconnects. A single or dual damascene interconnect structure is formed in a first dielectric layer. A cap layer or middle etch stop layer is formed over the interconnect structure and the first dielectric layer. The cap layer or the middle etch stop layer is treated with nitrogen plasma to convert a hydrophobic surface into a hydrophilic surface. An adhesion promoter layer is formed over the cap layer or middle etch stop layer. A low-k dielectric layer is formed over the adhesion promoter layer. A single or dual damascene structure is formed in the low-k dielectric layer, thereby forming a multilevel interconnect.

24 Claims, 5 Drawing Sheets

METHOD OF MANUFACTURING MULTILEVEL INTERCONNECTS INCLUDING PERFORMING A SURFACE TREATMENT TO FORM A HYDROPHILIC SURFACE LAYER

CROSS-REFERENCE TO RELATED APPLICATION

This application claims the priority benefit of Taiwan application serial no. 90104468, filed Feb. 27, 2001.

BACKGROUND OF THE INVENTION

1. Field of Invention

The present invention relates to a method of manufacturing multilevel interconnects. More particularly, the present invention relates to a method of manufacturing a cap layer or etching stop layer with improved surface wetting ability.

2. Description of Related Art

As dimensions of metal-oxide-semiconductor (MOS) transistor are shrunk to increase the level of integration of integrated circuits, more interconnects are required to connect the MOS transistors. An available area on a chip surface is not sufficient to accommodate all the necessary interconnects. This insufficiency is cured by employing an integrated circuit having two or more metallic layers, in other words, multilevel interconnects.

For advanced technology, it becomes a trend in the fabrication of semiconductor devices to use copper as the material for forming interconnects. This is because copper has a low resistivity and a high resistance of electromigration. Moreover, a copper layer can easily form over a substrate by electroplating or chemical vapor deposition. Hence, copper is frequently adopted in the fabrication of multilevel interconnects especially for deep sub-micron devices.

One conventional process of forming the multilevel interconnects is known as a dual damascene process. First, a dielectric layer is formed over a substrate. The dielectric layer is next etched, according to the desired conductive wire pattern and position of the via hole, to form a trench and a via hole. In other words, the lower portion of the dielectric layer is etched to form a vertical via hole that exposes a device region or a conductive wire in the substrate. This is followed by etching the upper portion of the dielectric layer to form a horizontal trench. Metallic material is deposited over the substrate to form a metallic layer that completely fills the trench and the vertical via hole, thereby forming a conductive wire and a via at the same time. After that, the upper surface is planarized by chemical-mechanical polishing before forming a cap layer on the substrate. Finally, another dual damascene structure is similarly formed in the horizontal trench and the vertical via opening over the substrate to complete a dual damascene process.

Alternatively, the dual damascene structure above can be formed by first forming a first dielectric layer, followed by forming a middle etch stop layer on the first dielectric layer. A second dielectric layer is then formed on the middle etch stop layer. The second dielectric layer is etched until the middle etch stop layer is exposed to form a horizontal trench. Finally, the first dielectric layer is etched until the cap layer is exposed to form a vertical via opening. This completes fabrication of the dual damascene structure.

When CMOS devices continue to shrink especially down to 0.18 $\mu$m generation and beyond, wiring delay due to multilevel interconnect becomes a dominant factor. To overcome the delay caused by capacitance effect when devices continue to shrink, a low dielectric constant material such as spin-on-polymer (SOP) is often used to form a low dielectric constant layer. However, such low dielectric constant materials are usually high molecular weight organic compound. On the other hand, material forming the cap layer is usually an inorganic dielectric compound such as silicon nitride or silicon carbide. In general, an organic low dielectric constant material has poor adhesion with an inorganic dielectric material. In other words, the poor coating/adhesion could be closely resulted from the poor wetting ability of an interface between the upper spin coating material and the under layer.

In addition, the cap layer is mainly used to prevent the diffusion of copper atoms. Most cap layers are made from silicon nitride or silicon carbide. Between silicon nitride or silicon carbide, the latter has a dielectric constant K (about 4–5) lower than the former, and silicon carbide has a better resistance to prevent the outward copper diffusion. Hence, silicon carbide is a better choice for acting as a barrier layer between a metallic layer and a dielectric layer. Intrinsically, the silicon carbide layer exhibits hydrophobic behavior. In terms of wetting ability for aqueous solution, silicon carbide would not exhibit a better coating/wetting ability with the upper layer, i.e. adhesion promoter, and with the following SOP low K material.

SUMMARY OF THE INVENTION

Accordingly, the first objective of the present invention is to provide a method of manufacturing multilevel interconnects having an enhanced wetting ability on a surface of the under layer.

The second objective of the invention is to provide a method of manufacturing multilevel interconnects capable of preventing the electromigration of copper.

To achieve these and other advantages and in accordance with the purpose of the invention, as embodied and broadly described herein, the invention provides a method of manufacturing multilevel interconnects. A dual damascene interconnect structure is formed with a cap layer is first formed over the interconnect structure. The cap layer is treated with a nitrogen-containing plasma treatment to modify the hydrophobic surface of silicon carbide into a hydrophilic surface. Then, an adhesion promoter layer is coated over the cap layer. After baking, solvent within the adhesion promoter layer is driven off. Thereafter, a low dielectric constant material is formed over the adhesion promoter layer followed by a bake and cure process for solvent removal and polymerization (cross-linking). A dual damascene opening is formed by patterning and etching the second dielectric layer. A barrier layer is formed over the exposed surface of the opening. A conductive material is deposited into the opening to form a multilevel interconnect.

The invention also provides a similar method of manufacturing multilevel interconnects. A first dielectric layer, a dual damascene interconnect structure, a cap layer, and a second dielectric layer are formed over a substrate. A middle etch stop layer is formed on the second dielectric layer, while the middle etch stop layer is treated with gaseous nitrogen to convert its hydrophobic surface into a hydrophilic surface. An adhesion promoter layer is formed over the middle etch stop layer, while solvent within the adhesion promoter layer is removed by baking. Thereafter, a third dielectric layer is formed over the adhesion promoter layer followed by a curing step to polymerize the third dielectric layer or to form a 3-dimensional crosslink in the third dielectric layer. A dual damascene opening is formed in the third dielectric layer. A barrier layer is formed over the exposed surface of the opening. A conductive material is deposited into the opening to form a multilevel interconnect.

According to this embodiment, one major aspect of this invention is the nitrogen gas treatment to the surface of the cap layer or the middle etch stop layer so that its surface changes from hydrophobic to hydrophilic. Hence, the wetting ability of the cap layer or the middle etch stop layer is increased and coating with the adhesion promoter and low dielectric constant material is much improved.

In addition, since both the cap layer and the dielectric layer are formed using lower dielectric constant material compared to the conventional dielectric materials, a semiconductor device having dielectric layers with low effective dielectric constant is achieved.

Furthermore, the cap layer or the middle etch stop layer above the interconnect structure can serve not only as a barrier that prevents the electromigration of copper atoms into the second dielectric layer, but also can serve as an etching stop layer for controlling etching depth. Therefore, over-etching into the under dielectric layer is avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
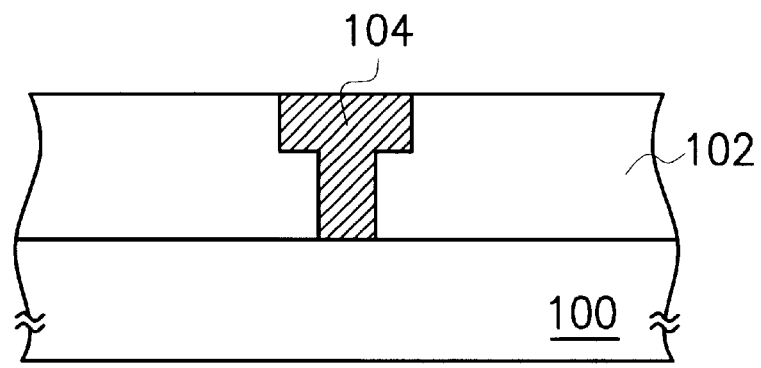
FIGS. 1A through 1E are schematic cross-sectional views showing the progression of steps for producing multilevel interconnect according to the first embodiment of the present invention.
Figure 1B:
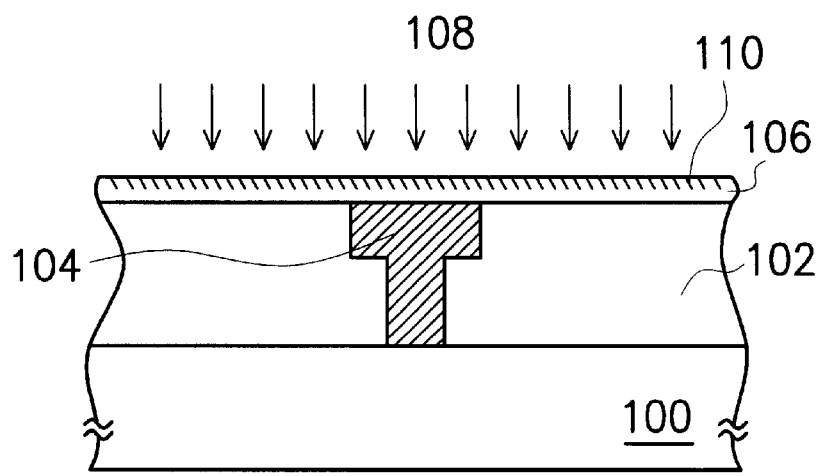

Reference will now be made in detail to the present preferred embodiments of the invention, examples of which are illustrated in the accompanying drawings. Wherever possible, the same reference numbers are used in the drawings and the description to refer to the same or like parts.
First Embodiment FIGS. 1A through 1E are schematic cross-sectional views showing the progression of steps for producing multilevel interconnect according to one preferred embodiment of this invention.

First, as shown in FIG. 1A, a substrate having devices or conductive wires (not shown) therein is provided. A first dielectric layer 102 is formed over the substrate 100. The first dielectric layer 102 is etched to form a vertical via hole (not shown) and a horizontal trench (not shown). The vertical via hole and the horizontal trench together constitute a dual damascene opening (not shown) that expose one of the device regions or conductive wires. A conductive layer (not shown) is formed over the substrate 100. The conductive layer completely fills the dual damascene opening to form an interconnect structure 104. The conductive layer can be a copper layer formed, for example, by sputtering.

As shown in 1B, a cap layer 106 is formed over the first dielectric layer 102 and the interconnect structure 104. The cap layer 106 can be a silicon carbide layer having a thickness of less than 500 Å. The silicon carbide layer is formed, for example, by chemical vapor deposition. A surface treatment 108 of the cap layer 106 is next conducted so that the hydrophobic surface of the cap layer 106 is transformed to a hydrophilic surface 110. The surface treatment 108 is carried out, for example, at a pressure of between 0.5 to 10 torrs and a temperature of between 350 to 450° C. for about 5 to 180 seconds, using nitrogen-containing gas source including $N_2$, $NH_3$, and $N_2O$ at a flow rate of between 500 sccm to 20000 sccm and radio frequency (RF) plasma generated at a power rating between 100 to 2000 W. Note that, timing of the surface treatment 108 must be carefully controlled to prevent the oxidation of a surface of the cap layer 106. Preferably, the surface is treated for a period such that the treated surface has a thickness smaller than 100 Å.

Figure 1C:
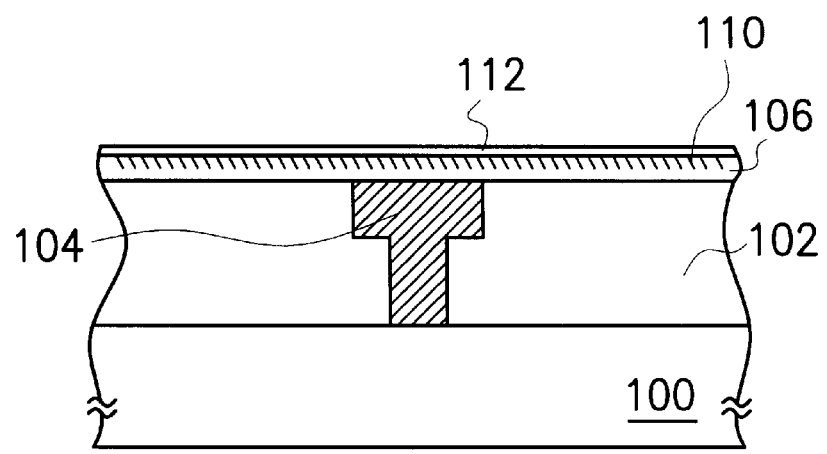

As shown in FIG. 1C, an adhesion promoter layer 112 is formed for example, by coating over the treated surface 110. Since the solution of adhesion promoter layer 112 is an aqueous substance, the hydrophilic surface 110 of the cap layer 106 would lead to a better wetting ability/coating performance for subsequent adhesion promoter coating. After baking, solvent in the adhesion promoter layer 112 is eliminated in a hydrophobic treatment step to form a very thin hydrophobic film less than 150 Å and to increase the adhesive strength between the surface 110 and the adhesion promoter layer 112 and/or a low k dielectric layer 114 which is formed subsequently. Note that solvent within the adhesion promoter layer 112 is driven off by baking on a hot plate.

Figure 1D:
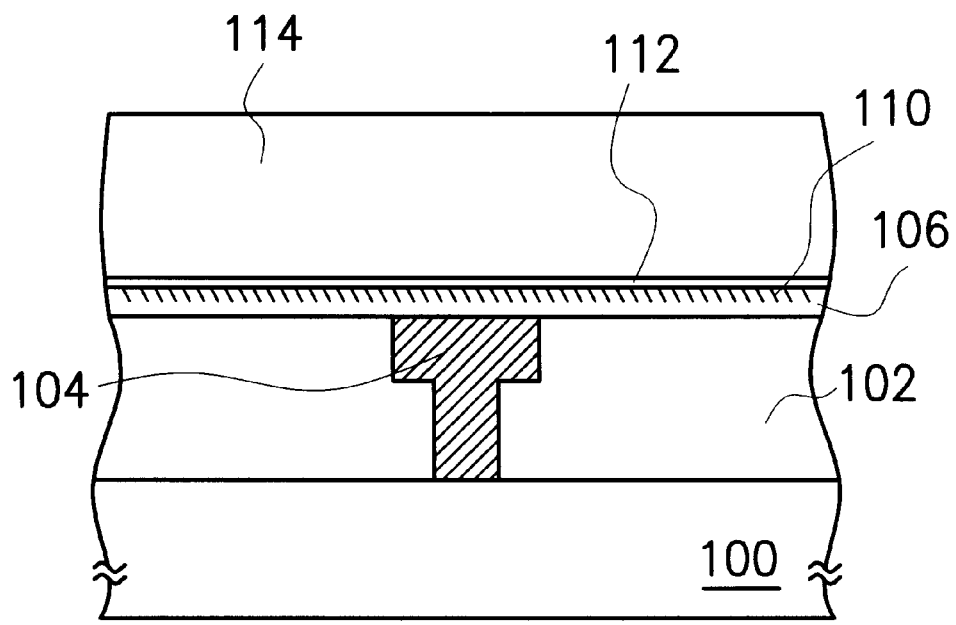

As shown in FIG. 1D, a second dielectric layer 114 is formed over the adhesion promoter layer 112. The second dielectric layer 114 is formed, for example, by spin coating a spin on polymer such as aromatic hydrocarbon and fluorine-incorporated aromatic hydrocarbon. A portion of the solvent within the second dielectric layer 114 is removed, for example, by baking on a hot plate. A curing step is then performed to polymerize the second dielectric layer or to form a 3-dimensional crosslink in the second dielectric layer.

Figure 1E:
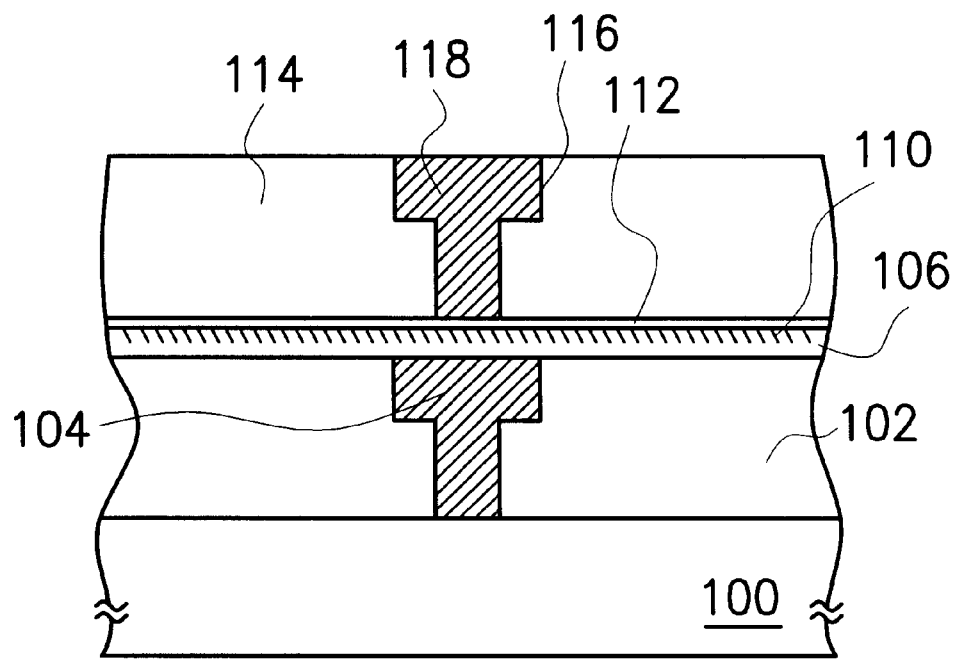

As shown in FIG. 1E, the second dielectric layer 114 is etched to form a dual damascene opening (not shown). A conformal barrier layer 116 is formed over the exposed surface of the dual damascene opening. The barrier layer 116 can be a titanium nitride (TiN) layer, a tantalum nitride (TaN) layer, or a tantalum (Ta) layer formed, for example, by sputtering. Conductive material is deposited into the dual damascene opening to form a conductive layer (not shown), thereby forming an interconnect structure 118. The conductive layer can be a copper layer, formed by electroplating or chemical vapor deposition.
Second Embodiment The second embodiment is described in a similar manner as the method disclosed with reference to FIGS. 1A through 1D in the first embodiment. A first dielectric layer 202, a metal interconnect structure 204, a cap layer 206, an adhesion promoter layer 210, and a second dielectric layer are formed over a substrate 200.

Figure 2A:
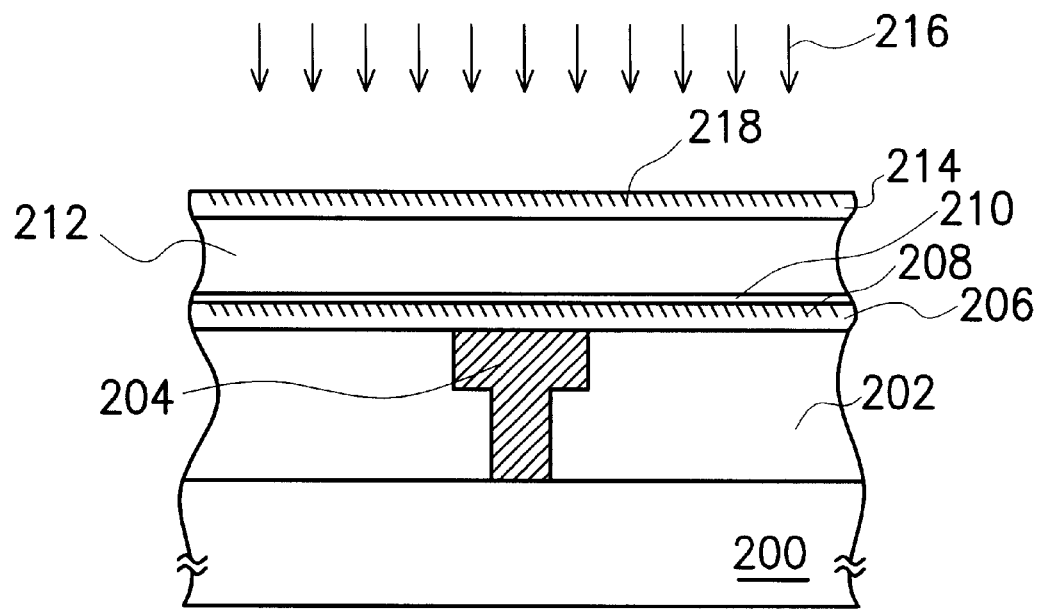
FIG. 2A through 2C are schematic cross-sectional views showing the progression of steps for producing multilevel interconnect according to the second embodiment of the present invention.

Referring to FIG. 2A, a middle etch stop layer 214 is formed over the second dielectric layer 212. The middle etch stop layer 214 can be a silicon carbide layer having a thickness less than 500 Å. The silicon carbide layer is formed, for example, by chemical vapor deposition. A surface treatment step 216 is performed on a surface of the middle etch stop layer 214 so that its hydrophobic surface is transformed to a hydrophilic surface 218. The surface treatment step 216 is carried out, for example, at a pressure of between 0.5 to 10 torrs and a temperature of between 350 to 450° C. for about 5 to 180 seconds, using nitrogen-containing gas source including $N_2$, $NH_3$, and $N_2O$ at a flow rate of between 500 sccm to 20000 sccm and radio frequency (RF) plasma generated at a power rating between 100 to 2000 W. Timing of the surface treatment step 218 must be carefully controlled such that the treated surface has a thickness smaller than 100 Å.

Figure 2B:
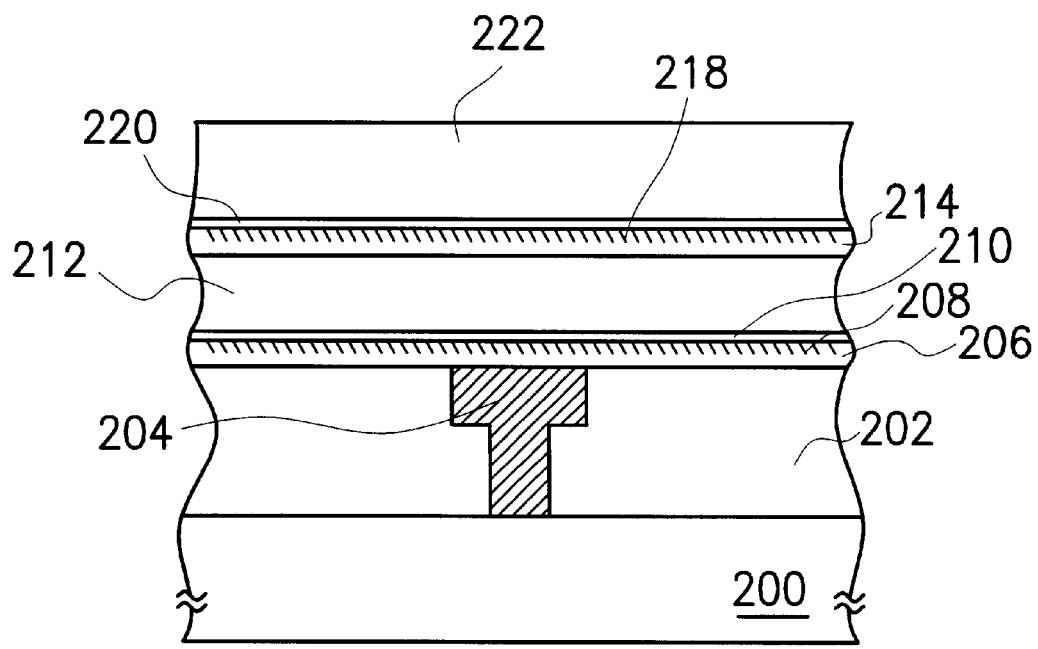

As shown in FIG. 2B, an adhesion promoter layer 220 is formed over the treated surface 214. The adhesion promoter layer 220 is formed, for example, by coating. Since the adhesion promoter layer 220 contains the nature of hydrophilic functional groups, it has a good adhesion with the hydrophilic surface 218 on the cap layer 214. The solvent in the adhesion promoter layer 220 is driven off with a hydrophobic treatment step to form a hydrophobic solid film. Solvent within the adhesion promoter layer 220 is driven off, for example, by baking on a hot plate.

After that a third dielectric layer 222 is formed on the adhesion promoter layer 220. The method of forming the third dielectric layer includes spin-on coating. The third dielectric layer is made of spin-on polymer, including but not limited to aromatic hydrocarbon and fluorine-containing aromatic hydrocarbon. A part of the solvent in the third dielectric layer is initially removed. The solvent is removed by baking using hot plate to evaporate off the solvent. Then, a curing step is performed to polymerize the third dielectric layer or to form a 3-dimensional crosslink in the third dielectric layer.

Figure 2C:
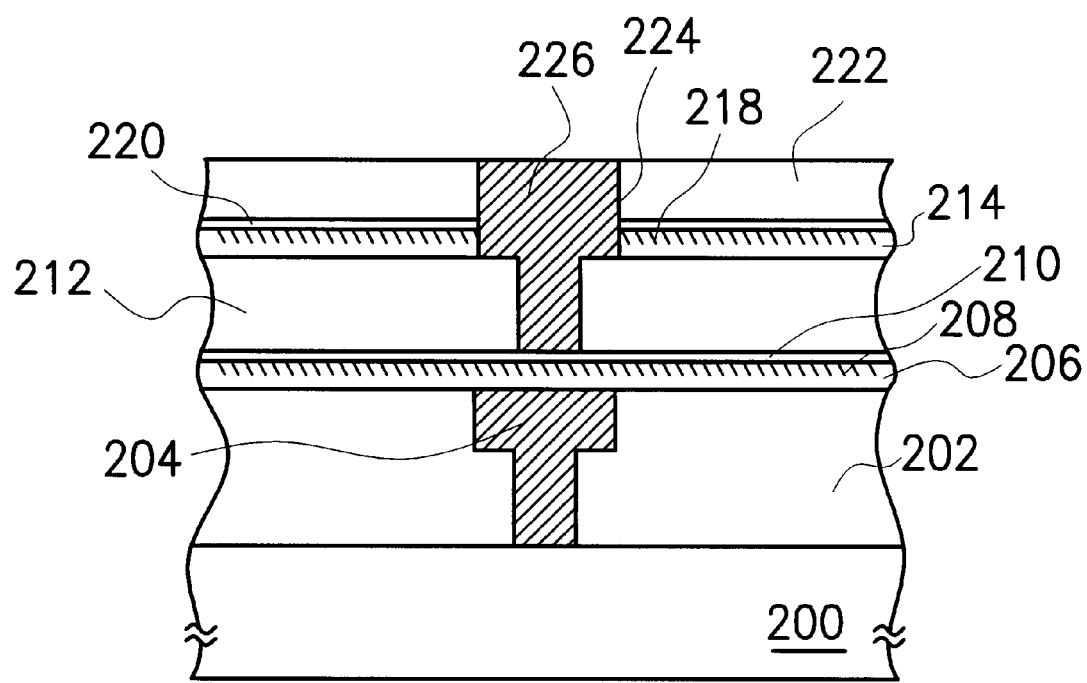

As shown in FIG. 2C, the second dielectric layer 212 and the third dielectric layer are etched to form a dual damascene opening (not shown). A conformal barrier layer 224 is formed over the exposed surface of the dual damascene opening. The barrier layer 224 can be made of material selected from a group consisting of titanium nitride (TiN), tantalum nitride (TaN) and tantalum (Ta), for example, by sputtering. Conductive material is deposited into the dual damascene opening to form a conductive layer (not shown), thereby forming an interconnect structure 226. The conductive layer can be a copper layer, formed, for example, by chemical vapor deposition.

Figure 3A:
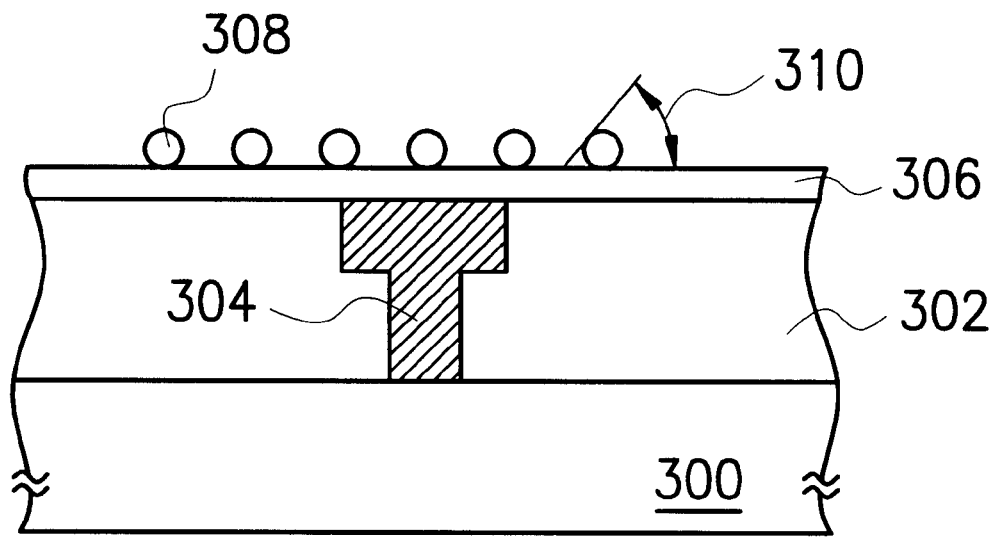
FIG. 3A is a schematic cross-sectional diagram showing the wetting ability of the surface of a silicon carbide layer and a contact angle of adhesion promoter agent with the surface of the silicon carbide layer before a nitrogen plasma treatment.

FIG. 3A is a schematic cross-sectional diagram showing the wetting ability of the surface of a silicon carbide layer and a contact angle of adhesion promoter agent with the surface of the silicon carbide layer before a nitrogen plasma treatment. As shown in FIG. 3A, naturally the silicon carbide layer 306 without the treatment has a chemical structure Si—$CH_3$. A surface with the Si—$CH_3$ chemical structure exhibits intrinsically hydrophobic behavior. In terms of wetting ability of adhesive absorptive force, when an adhesive promoter layer containing aqueous solution was spun on silicon carbide, the adhesive force coming from adhesion promoter layer 308 would be larger than the absorptive force coming from silicon carbide due to the nature of the silicon carbide layer 306. Subsequently, the contact angle of water without the $N_2$ treatment for silicon carbide would be significantly higher than that with $N_2$ treatment for silicon carbide.

Figure 3B:
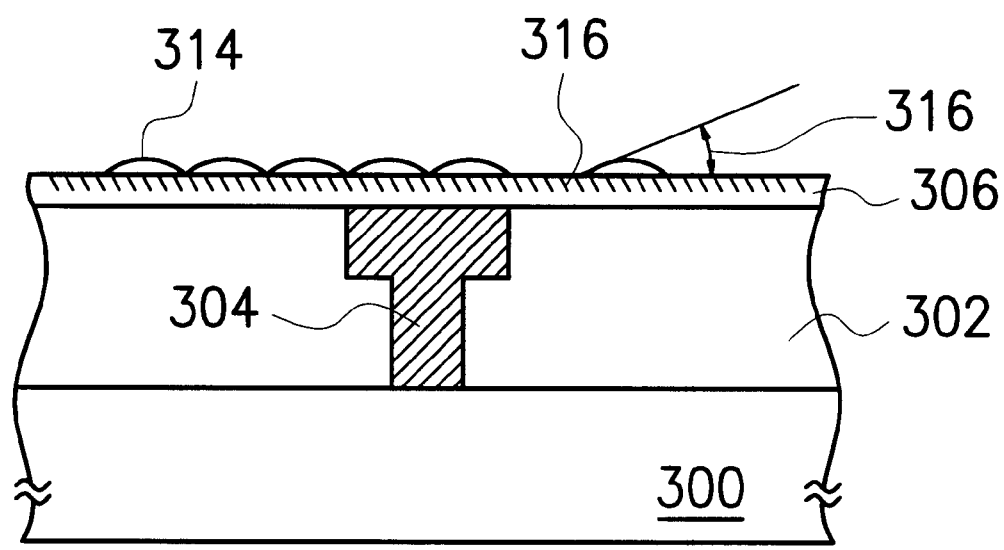
FIG. 3B is a schematic cross-sectional diagram showing the wetting ability of the surface of a silicon carbide layer and the contact angle of adhesion promoter agent with the surface of the silicon carbide layer after a nitrogen plasma treatment.

FIG. 3B is a schematic cross-sectional diagram showing the wetting ability of a silicon carbide layer after a nitrogen plasma treatment. As shown in FIG. 3B, after the treatment of the silicon carbide layer 306, some of Si—$CH_3$ bonding chemical bonding has been broken up and transformed to a Si—OH chemical bonding or forming a N—H bonding. Since OH radical and/or N—H group has much better ability for capturing water moisture, adhesion between the adhesion promoter solution 314 and the surface 312 is much better than before. Consequently, the adhesion promoter solution 314 can easily be spread over the silicon carbide surface 312. In other words, a small contact angle of water 316 after treatment could be expected with respect to the silicon carbide layer 306. Table 1 lists the comparison of the contact angle of water on a silicon carbide surface before and after surface treatment. Before surface treatment, water on the silicon carbide surface has a contact angle ranging from 60° to 90°. In other words, the adhesion between water molecule and untreated silicon carbide surface is not so good. On the contrary, after surface treatment, water on the silicon carbide surface has been spread with a contact angle between 5° to 25°. Hence, there is an evident improvement in the adhesion between water and the silicon carbide surface.

TABLE 1

Comparison of contact angle of water on silicon carbide with nitrogen plasma treatment and without nitrogen plasma treatment

|  | silicon carbide surface without nitrogen plasma treatment | Silicon carbide surface with nitrogen plasma treatment |
| --- | --- | --- |
| Contact angle between water and silicon carbide surface | 60°~90° | Up to 5°~25° |

According to the embodiment of this invention, one major aspect is the surface treatment for the cap layer or middle etch stop layer using nitride containing gas, such as $N_2$, $NH_3$, and $N_2O$, so that the surface of the cap layer is transformed from hydrophobic to hydrophilic. Hence, the wetting ability of the cap layer is increased and adhesion with low dielectric constant material is much improved.

In addition, since the cap layer, middle etch stop layer, and the dielectric layer are formed using low dielectric constant material compared to the conventional dielectric material, a semiconductor device with the dielectric layers having an effective lower dielectric constant is obtained.

Furthermore, the cap layer that is formed above the interconnect structure can serve not only as a barrier that prevents the diffusion and/or electromigration of copper atoms into the second dielectric layer, but also can serve as an etching stop layer for controlling etching depth. Therefore, over-etching into the first dielectric layer is avoided when the second dielectric layer and the third dielectric layer are etched.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing multilevel interconnects, comprising the steps of:
   providing a substrate, wherein the substrate has a first dielectric layer thereon and the first dielectric layer has a first interconnect structure therein;
   forming a cap layer over the first dielectric layer and the first interconnect structure;
   performing a surface treatment of the cap layer to convert the surface of the cap layer into a hydrophilic layer;
   forming a adhesion promoter layer over the cap layer;
   forming a second dielectric layer over the adhesion promoter layer; and
   sequentially forming a barrier layer and a second interconnect structure in the second dielectric layer.

2. The method of claim 1, wherein material constituting the cap layer includes silicon carbide.

3. The method of claim 1, wherein the surface treatment step uses a gas selected from a group consisting of $N_2$, $NH_3$, and $N_2O$.

4. The method of claim 3, wherein the surface treatment step is performed at a pressure of about 0.5–10 Torr.

5. The method of claim 3, wherein the surface treatment step includes a radio frequency plasma with a power rating of about 100–2000 W.

6. The method of claim 3, wherein the surface treatment step is conducted at a temperature of between 250° C. to 500° C.

7. The method of claim 3, wherein the surface treatment step has a duration of about 5–180 seconds.

8. The method of claim 1, wherein the second dielectric layer includes a spin-on polymer.

9. A fabrication method for a cap layer, the method comprising steps of:
   providing a substrate with a first dielectric layer formed thereon, wherein the first dielectric layer has an interconnect structure formed therein;
   forming a cap layer over the first dielectric layer and the interconnect structure; and
   performing a surface treatment step on a surface of the cap layer, so that a hydrophilic surface is formed on the cap layer.

10. The fabrication method of claim 9, wherein the cap layer includes silicon carbide.

11. The fabrication method of claim 9, wherein the surface treatment step uses a gas selected from a group consisting of $N_2$, $NH_3$, and $N_2O$.

12. The fabrication method of claim 11, wherein the surface treatment step is performed at a pressure of about 0.5–10 Torr.

13. The fabrication method of claim 11, wherein the surface treatment step includes a radio frequency plasma with a power rating of about 100–2000 W.

14. The fabrication method of claim 11, wherein the surface treatment step is conducted at a temperature of between 250° C. to 500° C.

15. The fabrication method of claim 11, wherein the surface treatment step has a duration of about 5–180 seconds.

16. A method of manufacturing multilevel interconnects, comprising the steps of:
   providing a substrate formed with a first interconnect structure followed by forming a cap layer, a first adhesion promoter layer, and a first dielectric layer over the substrate;
   forming a middle etch stop layer on the first dielectric layer;
   performing a surface treatment step on the middle etch stop layer, so that a hydrophilic surface is formed on the middle etch stop layer;
   forming a second adhesion promoter layer on the middle etch stop layer;
   forming a second dielectric layer on the second adhesion promoter layer; and
   forming a second interconnect structure in the second dielectric layer and the first dielectric layer.

17. The method of claim 16, wherein the middle etch stop layer and the cap layer include silicon carbide.

18. The method of claim 16, wherein the surface treatment step uses a gas selected from a group consisting of $N_2$, $NH_3$, and $N_2O$.

19. The method of claim 18, wherein the surface treatment step is performed at a pressure of about 0.5–10 Torr.

20. The method of claim 18, wherein the surface treatment step includes a radio frequency plasma with a power rating of about 100–2000 W.

21. The method of claim 18, wherein the surface treatment step is conducted at a temperature of between 250° C. to 500° C.

22. The method of claim 18, wherein the surface treatment step has a duration of about 5–180 seconds.

23. The method of claim 16, wherein the surface treatment step is performed on the cap layer.

24. The method of claim 16, wherein the first dielectric layer and the second dielectric layer include spin coat polymer.

* * * * *